United States Patent
Scott et al.

(10) Patent No.: US 10,181,478 B2
(45) Date of Patent: Jan. 15, 2019

(54) RADIO FREQUENCY SWITCH HAVING FIELD EFFECT TRANSISTOR CELLS

(71) Applicant: Qorvo US, Inc., Greensboro, NC (US)

(72) Inventors: Baker Scott, San Jose, CA (US);
George Maxim, Saratoga, CA (US);
Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/494,605

(22) Filed: Apr. 24, 2017

(65) Prior Publication Data

US 2018/0197881 A1 Jul. 12, 2018

Related U.S. Application Data

(60) Provisional application No. 62/443,047, filed on Jan. 6, 2017.

(51) Int. Cl.
*H01L 27/12* (2006.01)
*H01L 27/02* (2006.01)
(Continued)

(52) U.S. Cl.
CPC ........ *H01L 27/1203* (2013.01); *H01L 23/482* (2013.01); *H01L 27/0207* (2013.01);
(Continued)

(58) Field of Classification Search
CPC ........... H01L 29/78615; H01L 29/7841; H01L 27/0207; H01L 27/0629; H01L 27/0805;
(Continued)

(56) References Cited

U.S. PATENT DOCUMENTS 5,661,414 A  8/1997  Shigehara et al.
5,689,144 A  11/1997  Williams
(Continued)

FOREIGN PATENT DOCUMENTS

EP  1184977 A2  3/2002
WO  2005117255 A1  12/2005

OTHER PUBLICATIONS

Hoppenjans, Eric E. et al., "A Vertically Integrated Tunable UHF Filter," International Microwave Symposium Digest (MTT), May 23-28, 2010, Anaheim, California, IEEE, pp. 1380-1383.
(Continued)

*Primary Examiner* — David Chen
(74) *Attorney, Agent, or Firm* — Withrow & Terranova, P.L.L.C.

(57) ABSTRACT

An electronic component made up of field-effect transistor (FET) cells is disclosed. Each FET cell includes a finger region having drain, gate, and source fingers disposed over a semiconductor substrate. An isolation region extends across a first end of the finger region. An off-state linearization region abuts the first end of the isolation region. A doped well is disposed within the off-state linearization region over the semiconductor substrate. A dielectric layer is disposed over the doped region. A first conductive stripe is disposed over the dielectric layer in longitudinal alignment with the drain finger. A second conductive stripe is disposed over the dielectric layer in longitudinal alignment with the drain finger. A drain finger electrode is aligned over and coupled to both the drain finger and the first conductive stripe. A source finger electrode is aligned over and coupled to both the source finger and the second conductive stripe.

20 Claims, 6 Drawing Sheets

SECTION A-A'

(51) Int. Cl.
*H01L 23/482* (2006.01)
*H01L 29/93* (2006.01)
*H01L 29/78* (2006.01)
*H03K 17/16* (2006.01)
*H01L 29/786* (2006.01)
*H01L 27/06* (2006.01)
*H03K 17/687* (2006.01)
*H01L 23/522* (2006.01)
*H01L 29/417* (2006.01)

(52) U.S. Cl.
CPC ...... *H01L 23/5222* (2013.01); *H01L 27/0629* (2013.01); *H01L 29/41725* (2013.01); *H01L 29/78* (2013.01); *H01L 29/78615* (2013.01); *H01L 29/93* (2013.01); *H03K 17/162* (2013.01); *H03K 17/687* (2013.01)

(58) Field of Classification Search
CPC ......... H03K 17/162; H03K 2217/0018; H03K 17/687; H03K 17/08142; H03K 17/145
USPC .................................. 257/E29.281, E29.344
See application file for complete search history.

(56) References Cited

U.S. PATENT DOCUMENTS

| | | | |
|---|---|---|---|
| 5,880,620 A | | 3/1999 | Gitlin et al. |
| 5,973,364 A | * | 10/1999 | Kawanaka ........ H01L 29/78612 |
| | | | 257/347 |
| 6,191,615 B1 | | 2/2001 | Koga |
| 8,729,948 B2 | | 5/2014 | Sugiura |
| 9,013,225 B2 | | 4/2015 | Madan et al. |
| 9,048,836 B2 | | 6/2015 | Maxim et al. |
| 9,628,075 B2 | | 4/2017 | Cebi et al. |
| 2002/0057139 A1 | | 5/2002 | Matsumura et al. |
| 2002/0079544 A1 | * | 6/2002 | Shino ................. H01L 27/1203 |
| | | | 257/388 |
| 2003/0085777 A1 | | 5/2003 | Kim et al. |
| 2005/0195063 A1 | | 9/2005 | Mattsson |
| 2006/0220727 A1 | | 10/2006 | Yen |
| 2007/0018247 A1 | * | 1/2007 | Brindle ............. H01L 29/78609 |
| | | | 257/347 |
| 2008/0237677 A1 | * | 10/2008 | Futatsugi .......... H01L 29/66075 |
| | | | 257/312 |
| 2011/0163824 A1 | | 7/2011 | Kawano |
| 2012/0081192 A1 | | 4/2012 | Hanaoka |
| 2012/0146149 A1 | * | 6/2012 | Momiyama ..... H01L 21/823878 |
| | | | 257/351 |
| 2013/0299890 A1 | * | 11/2013 | Oh ........................ H01L 27/108 |
| | | | 257/306 |
| 2015/0035582 A1 | | 2/2015 | Maxim et al. |
| 2015/0155278 A1 | * | 6/2015 | Seo ..................... H01L 27/0805 |
| | | | 257/296 |
| 2015/0341026 A1 | | 11/2015 | de Jongh |

OTHER PUBLICATIONS

Joshi, H. et al., "Tunable high Q narrow-band triplexer," IEEE MTT-S International Microwave Symposium Digest, Jun. 7-12, 2009, Boston, MA, IEEE, pp. 1477-1480.
Kamali-Sarvestani, Reza et al., "Fabrication of High Quality Factor RF-Resonator Using Embedded Inductor and Via Capacitor," IECON 2010—36th Annual Conference on IEEE Industrial Electronics Society, Nov. 7-10, 2010, Glendale, Arizona, IEEE, pp. 2283-2287.
International Search Report and Written Opinion for PCT/US2014/030431, dated Jun. 20, 2014, 14 pages.
Non-Final Office Action for U.S. Appl. No. 14/449,594, dated Oct. 10, 2014, 8 pages.
Notice of Allowance for U.S. Appl. No. 14/449,594, dated Feb. 4, 2015, 6 pages.
Non-Final Office Action for U.S. Appl. No. 15/907,631, dated Oct. 22, 2018, 8 pages.
Notice of Allowance for U.S. Appl. No. 15/939,625, dated Nov. 27, 2018, 7 pages.

* cited by examiner

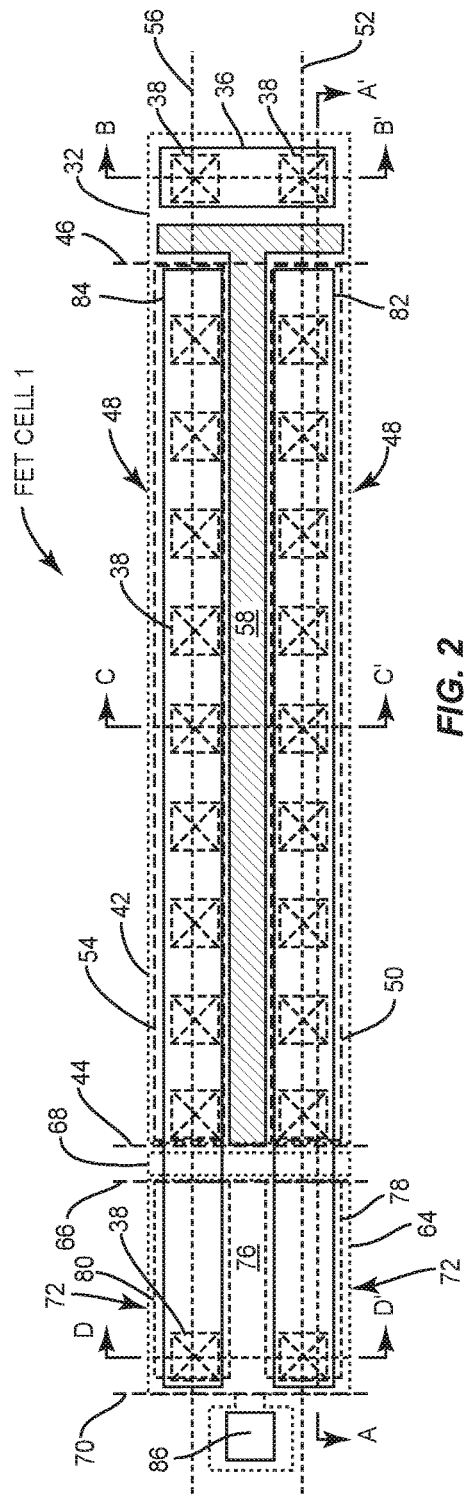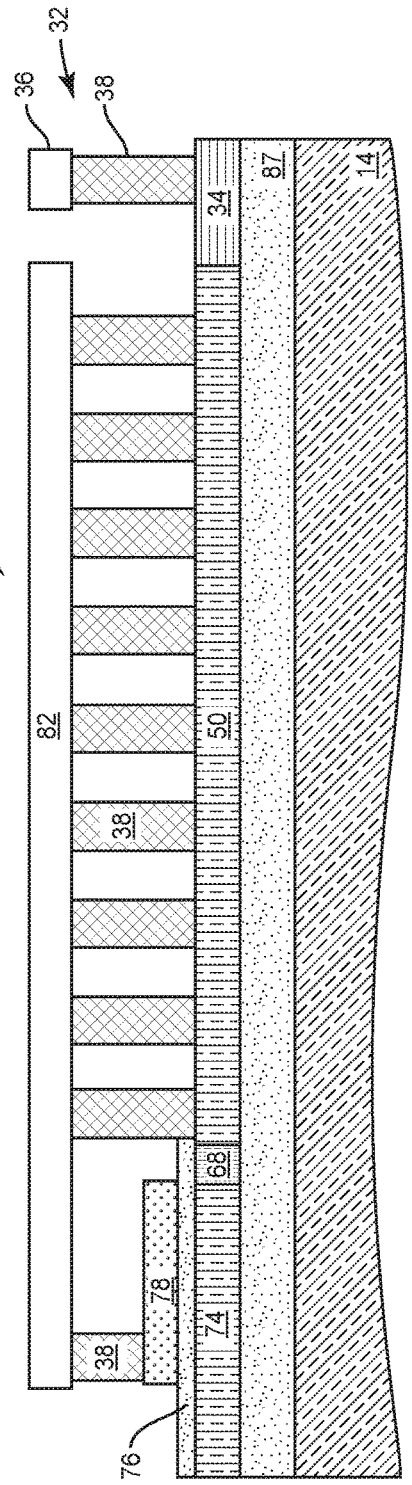

SECTION B-B'

SECTION C-C'

SECTION D-D'

RADIO FREQUENCY SWITCH HAVING FIELD EFFECT TRANSISTOR CELLS

RELATED APPLICATIONS

This application claims the benefit of provisional patent application Ser. No. 62/443,047, filed Jan. 6, 2017, the disclosure of which is hereby incorporated herein by reference in its entirety.

FIELD OF THE DISCLOSURE

Embodiments of the present disclosure relate to radio frequency switching circuitry.

BACKGROUND

An important electronic component of a radio frequency (RF) transceiver is a field-effect transistor (FET) that makes up stacked FET-type RF switches. An RF switch that is FET based typically needs linearity compensation to prevent generation of harmonic distortion when transmit signals are applied to the RF switch while the RF switch is in an off-state. The RF switch is effectively open while in the off-state, and the transmit signals are prevented from passing through the RF switch. However, while the RF switch is open, undesirable harmonics are generated from the transmit signals in part due to non-linear capacitance inherent to the RF switch. The undesirable harmonics pass from the RF switch and interfere with the RF transceiver's receiver circuitry.

A traditional approach to reducing the undesirable harmonics places an off-state linearization network in parallel with the RF switch. While this traditional approach does somewhat reduce the harmonic distortion when transmit signals are applied to the RF switch in the off-state, extra parasitic capacitance inherent to the off-state linearization network reduces figure of merit performance of the RF switch. Moreover, the off-state linearization network takes up valuable circuit real estate because it is external to the RF switch. What is needed is an electronic component having FET cells that make up a FET-based RF switch that does not reduce figure of merit performance of the RF switch due to extra parasitic capacitance. Moreover, there is a need for the RF switch based upon the FET cells to regain valuable real estate by intrinsically providing linearization for the RF switch and thus eliminate a need for external off-state linearization networks.

SUMMARY

An electronic component made up of field-effect transistor (FET) cells is disclosed. Each FET cell includes a finger region having a rectangular shape with a first end, a second end, and first sides. A drain finger is disposed over a semiconductor substrate along a drain axis that is in parallel with the first sides. A source finger is spaced from the drain finger and is disposed over the semiconductor substrate along a source axis that is in parallel with the first sides. A gate finger is disposed over the semiconductor substrate such that the gate finger is spaced between and in parallel with the drain finger and the source finger, wherein the finger region has a first non-linear off-state capacitance that increases as drain-to-source voltage increases within a first voltage range. An isolation region extends across the first end of the finger region.

The electronic component further includes an off-state linearization region having a rectangular shape with a third end that abuts the isolation region and a fourth end and second sides. A doped well is disposed over the semiconductor substrate and extends between the second sides from the third end to the fourth end. A dielectric layer is disposed over a doped region. A first conductive stripe is disposed over the dielectric layer between the third end and the fourth end in longitudinal alignment with the drain axis. A second conductive stripe is disposed over the dielectric layer between the third end and the fourth end in longitudinal alignment with the source axis. A drain finger electrode is aligned over and coupled to both the drain finger and the first conductive stripe. A source finger electrode is aligned over and coupled to both the source finger and the second conductive stripe.

In operation, the doped well and the dielectric layer together with the first and second stripes coupled to the drain finger electrode and source finger electrode, respectively, provide a second non-linear off-state capacitance that decreases as the drain-to-source voltage increases within the first voltage range. In exemplary embodiments, the first non-linear off-state capacitance and the second non-linear off-state capacitance add together to form a substantially linear total off-state capacitance. As a result of the substantially linear total off-state capacitance, undesirable harmonic distortion produced by an RF switch made up of two or more of the electronic component is reduced. Moreover, the off-state linearization region of the exemplary embodiments is an integral feature of each FET cell making up the electronic component. Due to the intrinsic nature of the off-state linearization region, RF switches constructed in accordance with the present disclosure have no need of external linearization networks. Thereby preserving figure of merit performance while reducing an overall size of RF switching circuitry.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 2 is a structural diagram depicting a top view of a field-effect transistor (FET) cell of the present disclosure.

FIG. 3 is a structural diagram depicting a lengthwise cross-sectional view of the FET cell taken along a cut line A-A' shown in the top view of FIG. 2.

DETAILED DESCRIPTION

Figure 1:
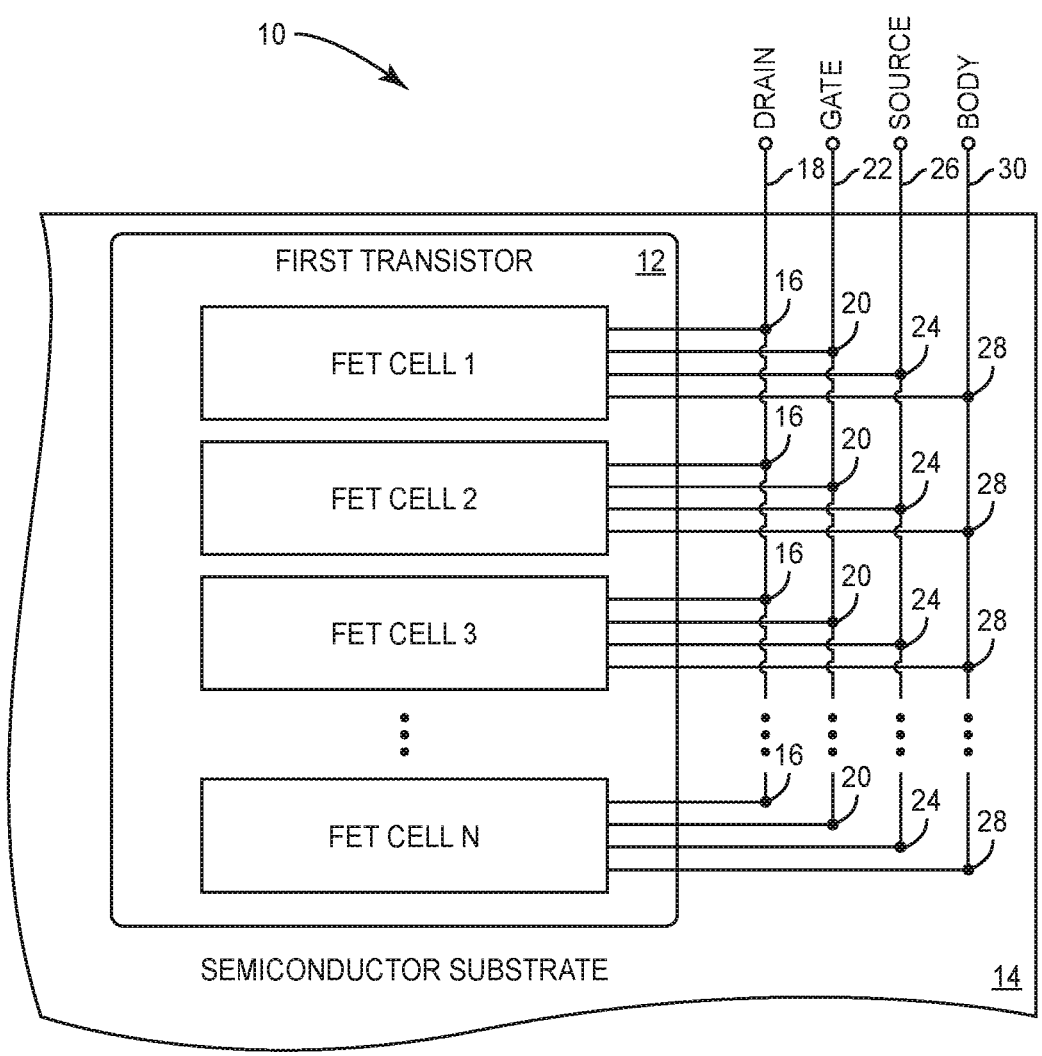
FIG. 1 depicts an electronic component of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, for the purpose of this disclosure, the term elongated as applied to the rectangular shape of a drain, source, and gate fingers is defined as having a side length that is at least twice as long as an end width. It is to be understood that side length as used herein is not a transistor layout dimension in which gate length is a shorter dimension than gate width. Also, for the purpose of this disclosure, the phrase substantially linear is defined as having no values that depart from an ideal linear relationship by more than ±10%.

FIG. 1 depicts an electronic component 10 of the present disclosure. The electronic component 10 includes a plurality of field-effect transistor (FET) cells that are depicted in FIG. 1 as FET cell 1, FET cell 2, and FET cell 3 through FET cell N that make up a first transistor 12 disposed on a semiconductor substrate 14. Each of the plurality of FET cells has a drain terminal 16 coupled to a drain bus 18, a gate terminal 20 coupled to a gate bus 22, a source terminal 24 coupled to a source bus 26, and a body terminal 28 coupled to a body bus 30.

Figure 4:
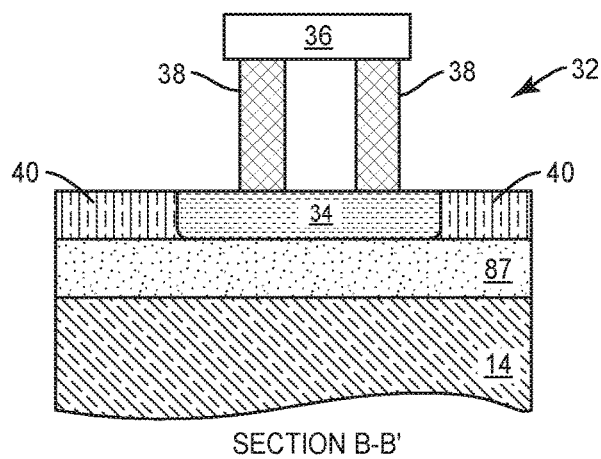
FIG. 4 is a structural diagram depicting a cross-sectional view of the FET cell taken along a cut line B-B' shown in the top view of FIG. 2.
Figure 5:
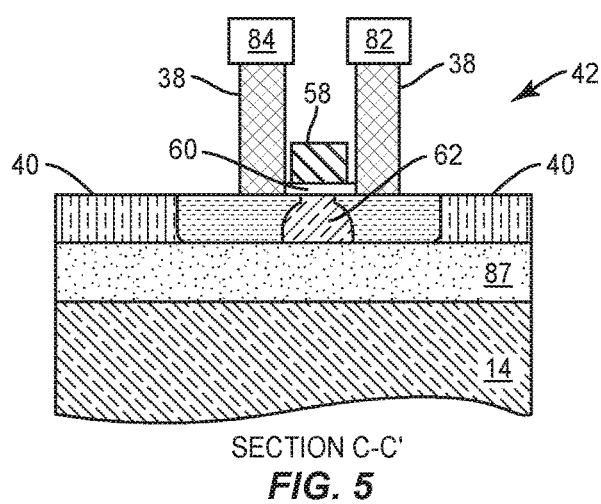
FIG. 5 is a structural diagram depicting a cross-sectional view of the FET cell taken along a cut line C-C' shown in the top view of FIG. 2.
Figure 6:
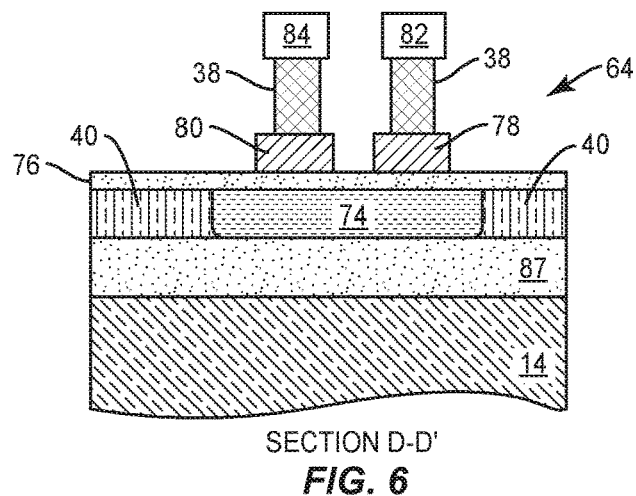
FIG. 6 is a structural diagram depicting a cross-sectional view of the FET cell taken along a cut line D-D' shown in the top view of FIG. 2.

FIG. 2 is a structural diagram depicting a top view of the FET cell 1. FIG. 3 is a structural diagram depicting a lengthwise cross-sectional view of the FET cell 1 taken along a cut line A-A' shown in the top view of FIG. 2. FIG. 4 is a structural diagram depicting a cross-sectional view of the FET cell 1 taken along a cut line B-B' shown in the top view of FIG. 2. FIG. 5 is a structural diagram depicting a cross-sectional view of FET cell 1 taken along a cut line C-C' shown in the top view of FIG. 2. FIG. 6 is a structural diagram depicting a cross-sectional view of the FET cell 1 taken along a cut line D-D' shown in the top view of FIG. 2. The structural diagram of FET cell 1 is also representative of FET cell 2 through FET cell N.

As shown in FIG. 2, FIG. 3, and FIG. 4, each FET cell of the plurality of FET cells represented by FET cell 1 includes a body contact region 32 that is configured to receive a body bias voltage. As best viewed in FIG. 3 and FIG. 4, the body contact region 32 includes a body well 34 disposed over the semiconductor substrate 14. In an exemplary n-channel embodiment of the electronic component 10, the body well 34 has P+ doping. In contrast, an exemplary p-channel embodiment of the electronic component 10, the body well 34 has N+ doping. A body electrode 36 is coupled to the body well 34 by electrically conductive contacts 38. In exemplary embodiments, the body electrode 36 is formed of a metal stripe within a metal layer of the electronic component 10. As shown in FIG. 4, isolation trenches 40 filled with a dielectric material extend alongside the body well 34.

As best viewed in FIG. 2, FET cell 1 includes a finger region 42 having a rectangular shape with a first end 44, a second end 46, and first sides 48. A drain finger 50 is disposed over the semiconductor substrate 14 along a drain axis 52 that is in parallel with the first sides 48. A source finger 54 is spaced from the drain finger 50 and is disposed over the semiconductor substrate 14 along a source axis 56 that is in parallel with the first sides 48. The drain finger 50 and the source finger 54 are elongated doped regions that extend at least over half a distance from the first end 44 to the second end 46 of the finger region 42. The drain finger 50 and the source finger 54 have a same type of doping. For example, if the drain finger 50 has n+ doping, the source finger 54 also has n+ doping. In alternative embodiments, if the drain finger 50 has p+ doping, the source finger 54 also has p+ doping.

A gate finger 58 is disposed over the semiconductor substrate 14 such that the gate finger 58 is spaced between and in parallel with the drain finger 50 and the source finger 54. In exemplary embodiments, the gate finger 58 is made of polysilicon. The gate finger 58 is elongated and extends at least over half the distance between the first end 44 and the second end 46. As best viewed in FIG. 5, a gate oxide layer 60 separates the gate finger 58 from a channel well 62 that is disposed over the semiconductor substrate 14. The channel well 62 has doping that is opposite in polarity of the drain finger 50 and source finger 54. For example, in one embodiment, the drain finger 50 and the source finger 54 have n+ doping and the channel well 62 has p+ doping. In another embodiment, the drain finger 50 and the source finger 54 have p+ doping and the channel well 62 has n+ doping.

During operation, when a radio frequency (RF) switch made up of a plurality of the electronic components 10 is in an off-state, a first non-linear off-state capacitance that is inherent to the finger region 42 increases in capacitance as drain-to-source voltage increases within a first voltage range when transmit-level RF signals are applied across the RF switch. In an exemplary embodiment, the first voltage range is between 10 V and 100 V. In another exemplary embodiment, the first voltage range is between 40 V and 80 V.

The first non-linear off-state capacitance is undesirable because the first non-linear off-state capacitance is a dominant factor in the generation of undesirable harmonic distortion when the RF switch is in the off-state. The present disclosure provides a linearization region 64 that is intrinsic to the FET cell 1 that has a second non-linear off-state capacitance that decreases as the drain-to-source voltage increases within the first voltage range. The second non-linear off-state capacitance is scaled so that a summation of the first non-linear off-state capacitance and the second non-linear off-state capacitance results in a total off-state capacitance that is substantially linear within the first voltage range of the drain-to-source voltage. Moreover, the total off-state capacitance is also substantially linear within a second voltage range that is between 0 V and a lowest voltage of the first voltage range.

As shown in FIG. 2, the off-state linearization region 64 has a rectangular shape with a third end 66 that abuts an isolation region 68 that separates the finger region 42 from the off-state linearization region 64. The isolation region 68 extends across the first end 44 of the finger region 42 and also has a fourth end 70 and second sides 72. In an exemplary embodiment, the isolation region 68 is a shallow trench isolation filled with a dielectric material such as silicon dioxide. The isolation region 68 prevents current from leaking between the off-state linearization region 64 and the finger region 42.

As shown in FIG. 3, the off-state linearization region 64 includes a doped well 74 that is disposed over the semiconductor substrate 14 and extends between the second sides 72 from the third end 66 to the fourth end 70. In one exemplary embodiment, the doped well 74 has n+ doping. In contrast, in another embodiment, the doped well 74 has p+ doping. The doped well 74 is configured to function as a first capacitor plate that accumulates charges for the second non-linear off-state capacitance.

A dielectric layer 76 is disposed over the doped well 74 to provide an electric field region for the second non-linear off-state capacitance. In one exemplary embodiment, the dielectric layer 76 is made of silicon dioxide. In exemplary embodiments, a dielectric constant of the dielectric layer 76 ranges from 3.9 to 3.5 with doping. In other exemplary embodiments, the dielectric constant ranges from 3.5 to 3.0 with carbon doping. In yet other exemplary embodiments, the dielectric layer 76 is made of porous silicon dioxide to yield a dielectric constant that ranges from 3.0 to 2.0.

A first conductive stripe 78 is disposed over the dielectric layer 76 between the third end 66 and the fourth end 70 of the off-state linearization region 64 such that the first conductive stripe 78 is in longitudinal alignment with the drain axis 52. The first conductive stripe 78 is configured as a second capacitor plate that accumulates charges for the second non-linear off-state capacitance. A second conductive stripe 80 is disposed over the dielectric layer 76 between the third end 66 and the fourth end 70 of the off-state linearization region 64 such that the second conductive stripe 80 is in longitudinal alignment with the source axis 56. The second conductive stripe 80 is configured as a third capacitor plate that accumulates charges for the second non-linear off-state capacitance. In at least one embodiment, the first conductive stripe 78 and the second conductive stripe 80 are made of polysilicon. However, it is to be understood that the first conductive stripe 78 and the second conductive stripe 80 can be made of other electrically conductive materials used in semiconductor device fabrication.

The second non-linear off-state capacitance intrinsic to the off-state linearization region 64 is coupled in parallel to the first non-linear off-state capacitance intrinsic to the finger region 42 by way of a drain finger electrode 82 and a source finger electrode 84 that both extend over the off-state linearization region 64. In particular, the drain finger electrode 82 is aligned over and coupled to both the drain finger 50 and the first conductive stripe 78 by additional ones of the electrically conductive contacts 38. The source finger electrode 84 is aligned over and coupled to both the source finger 54 and the second conductive stripe 80 also by additional ones of the electrically conductive contacts 38. It at least one embodiment, a varactor control electrode 86 is coupled to the doped well 74. The capacitance of the second non-linear off-state capacitance can be adjusted by way of the varactor control electrode 86.

Embodiments of the present disclosure can be fabricated using silicon-on-insulator technology. In such embodiments, the body region 32, the finger region 42, and the off-state linearization region 64 are insulated from the semiconductor substrate 14 by a buried oxide layer 87.

Figure 7:
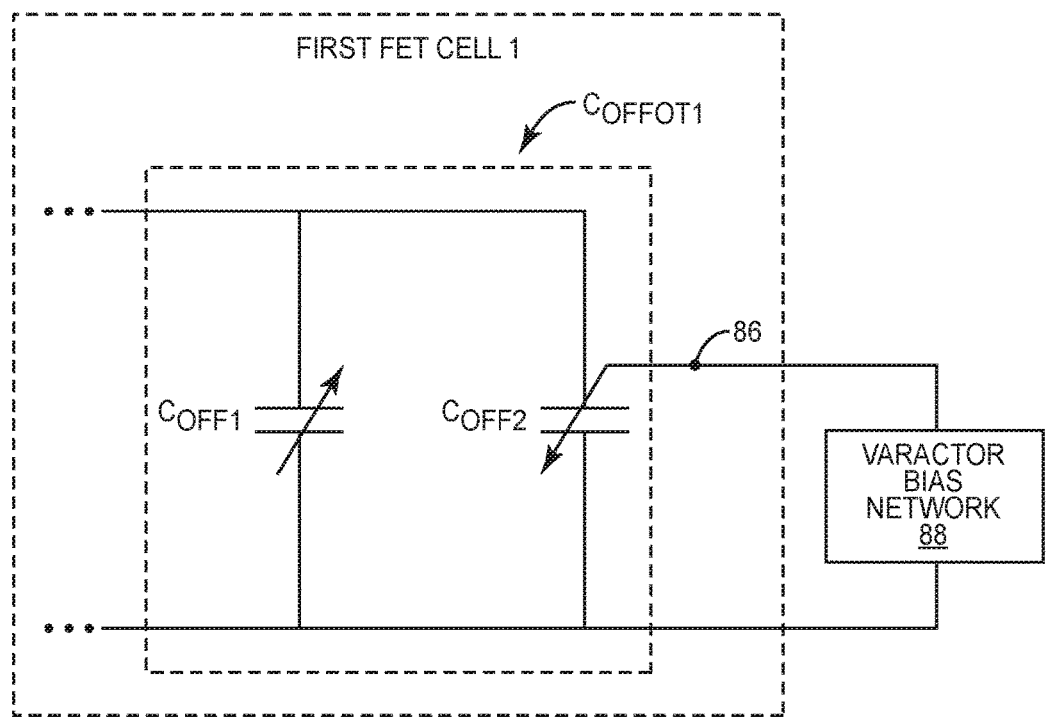
FIG. 7 is a circuit diagram depicting a model of the total off-state capacitance that is a parallel combination of the first non-linear off-state capacitance and the second non-linear off-state capacitance.

FIG. 7 is a circuit diagram depicting a model of the total off-state capacitance $C_{OFFTOT1}$ that is a parallel combination of the first non-linear off-state capacitance $C_{OFF1}$ and the second non-linear off-state capacitance $C_{OFF2}$. Due to the intrinsic nature of the second non-linear off-state capacitance $C_{OFF2}$, the total off-state capacitance $C_{OFFTOT1}$ is in parallel with the first transistor 12 (FIG. 1) when the first transistor 12 in the off-state.

A varactor bias network 88 is coupled to the varactor control electrode 86. In one exemplary embodiment, the varactor bias network 88 outputs a fixed bias voltage to the varactor control electrode 86. In other exemplary embodiments, the varactor bias network 88 outputs a bias voltage that adjusts the second non-linear off-state capacitance $C_{OFF2}$ in response to a process characteristic such as gate oxide thickness and/or to an operational environment such as temperature and supply voltage. In contrast with the first non-linear off-state capacitance $C_{OFF1}$, the second non-linear off-state capacitance $C_{OFF2}$ decreases with increasing RF signal voltage applied across the drain finger 50 and the source finger 54 well. The gate finger 58 is held at an off-state gate voltage to block RF signal current from flowing between the drain finger 50 and the source finger 54.

Figure 8:
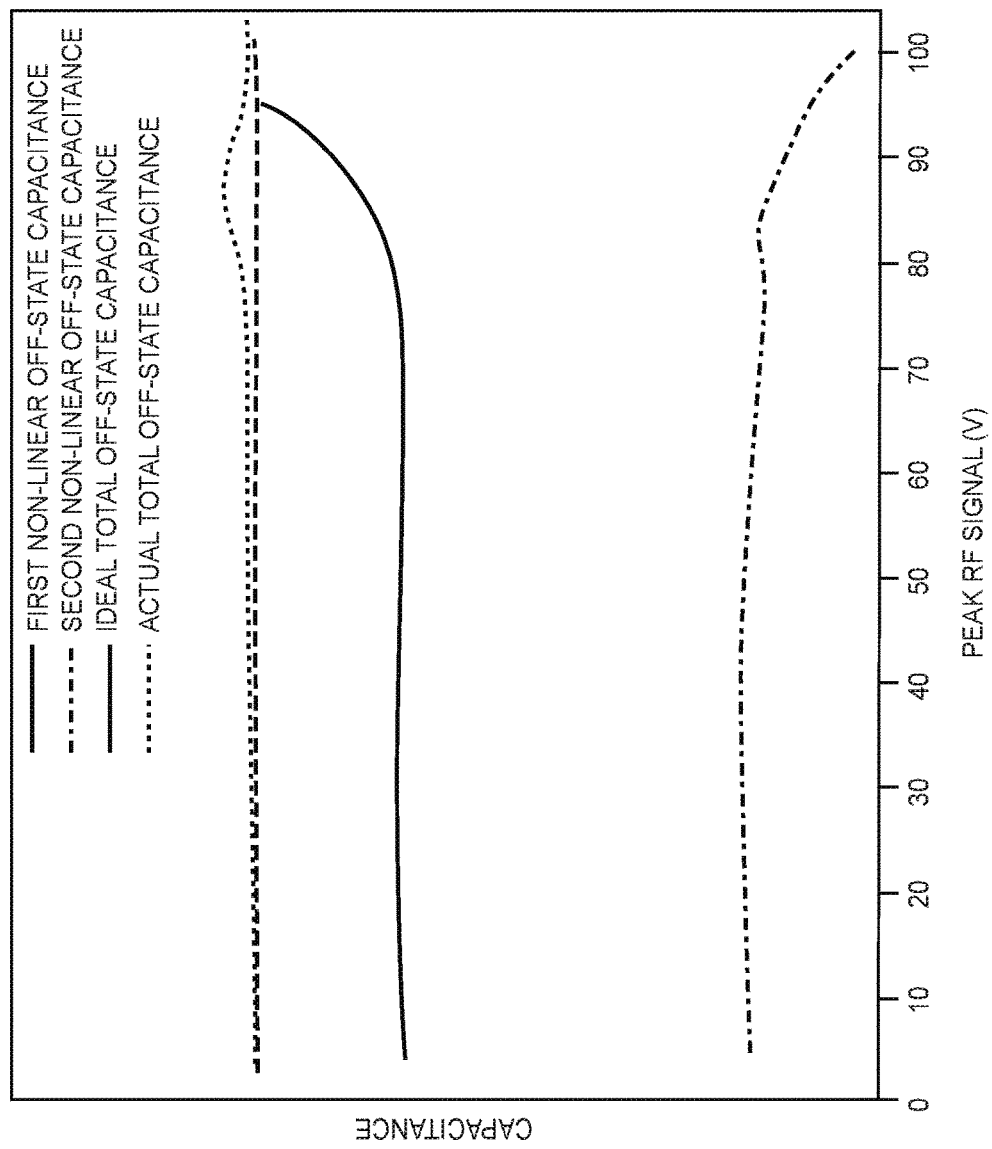
FIG. 8 is a graph of first non-linear off-state capacitance and second non-linear off-state capacitance as a function of peak radio frequency signal voltage applied across the drain finger and the source finger.

FIG. 8 is a graph of first non-linear off-state capacitance $C_{OFF1}$ and second non-linear off-state capacitance $C_{OFF2}$ as a function of peak RF signal voltage applied across the drain finger 50 and the source finger 54. Also depicted are an ideal total off-state capacitance and the actual total off-state capacitance $C_{OFFTOT1}$ that results from a parallel combination of the first off-state capacitance $C_{OFF1}$ and the second off-state capacitance $C_{OFF2}$. In the exemplary embodiment of FIG. 8, the operational range is from 0 V to 100 V. In one embodiment, the total off-state capacitance $C_{OFFTOT1}$ is within ±10% of a fixed capacitance value of the ideal total capacitance for an RF switch made up of the FET cells over a first operational range of 10 V to 100 V. In another embodiment, the total off-state capacitance $C_{OFFTOT1}$ is within ±5% of the fixed capacitance value of the ideal total capacitance for an RF switch made up of the FET cells over a first operational range of 30 V to 80 V. In another embodiment, the total off-state capacitance $C_{OFFTOT1}$ is within ±1% of the fixed capacitance value of the ideal total capacitance for an RF switch made up of the FET cells over a second operational range of 0 V to 30 V. It is to be understood that various RF switches constructed in accordance with the present disclosure have various operational ranges that will have maximum RF signal voltages that are greater than or less than the 100 V of the exemplary range. The maximum voltage depends upon the technology implemented such as, for example, gallium nitride versus gallium arsenide, as well as the number of FET transistors used to make up the RF switch.

Figure 9:
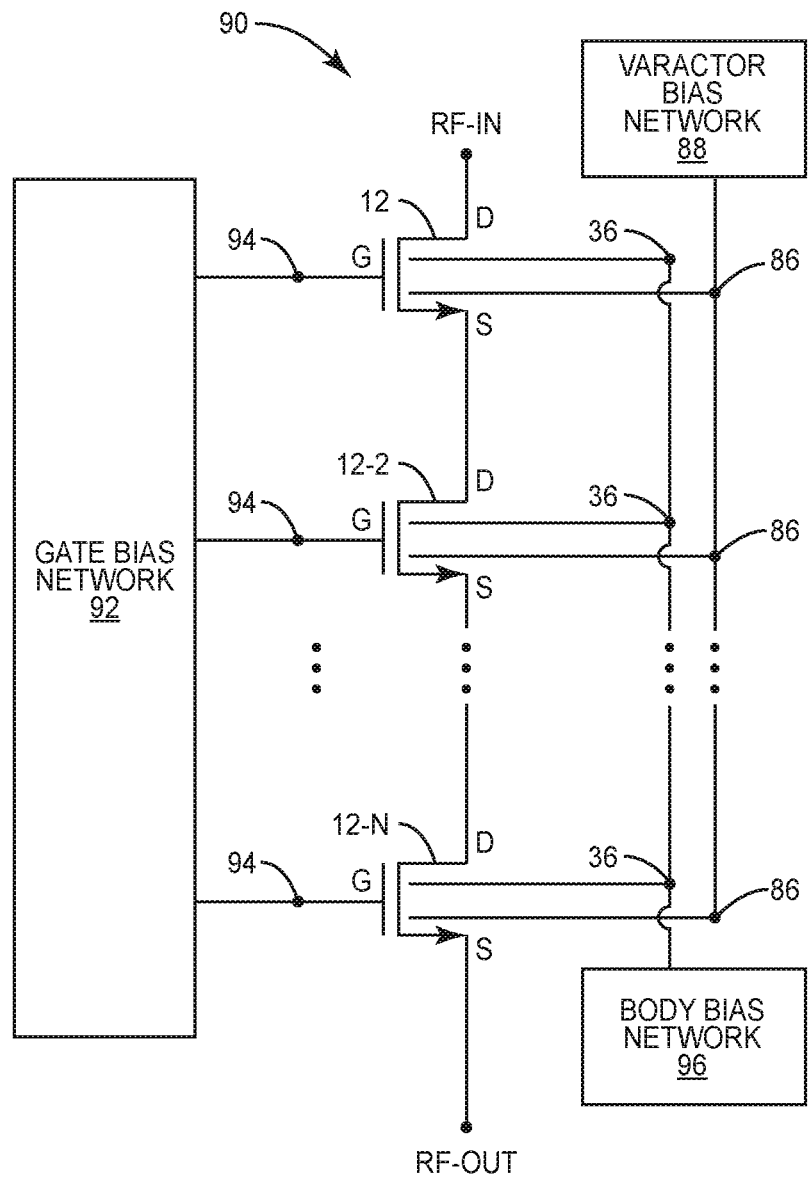
FIG. 9 is a circuit schematic that depicts a radio frequency switch constructed in accordance with the present disclosure.

In this regard, FIG. 9 is a circuit schematic that depicts an RF switch 90 constructed in accordance with the present disclosure. The RF switch 90 is made up of a plurality of FETs made up the first transistor 12, and a second transistor 12-2 through a subsequent transistor 12-N, wherein N is a non-infinite natural number. The first transistor 12, and a second transistor 12-2 through a subsequent transistor 12-N are coupled in series between an RF signal input terminal RF-IN and an RF signal output terminal RF-OUT. The RF switch 90 is coupled to a gate bias network 92 that applies one or more gate bias voltages to gate electrodes 94. The RF switch 90 is further coupled to a body bias network that applies a body bias voltage to body electrode 36. The body bias voltage provides reduced subthreshold leakage current and fine tunes the threshold voltage of the FETs making up the RF switch 90. The varactor bias network 88 is coupled to the varactor control electrodes 86. The varactor bias network 88 provides a fine tuning for the second off-state capacitance $C_{OFF2}$ that counters the first off-state capacitance $C_{OFF1}$. A body bias network 96 is included in some embodiments to provide fine tuning of transistor threshold voltage. In some embodiments, the body bias network is eliminated and the body electrode 36 is coupled to a fixed voltage node such as ground.

Those skilled in the art will recognize improvements and modifications to the preferred embodiments of the present disclosure. All such improvements and modifications are considered within the scope of the concepts disclosed herein and the claims that follow.

What is claimed is:

1. An electronic component comprising a plurality of field-effect transistor (FET) cells that form a first transistor over a semiconductor substrate, wherein each FET cell of the plurality of FET cells comprises:
   a finger region having a rectangular shape with a first end, a second end, and first sides comprising:
      a drain finger disposed over the semiconductor substrate along a drain axis that is in parallel with the first sides;
      a source finger spaced from the drain finger and disposed over the semiconductor substrate along a source axis that is in parallel with the first sides;
      a gate finger disposed over the semiconductor substrate such that the gate finger is spaced between and in parallel with the drain finger and the source finger, wherein the finger region has a first non-linear off-state capacitance that increases as drain-to-source voltage increases within a first voltage range;
   an isolation region that extends across the first end of the finger region;
   an off-state linearization region having a rectangular shape with a third end that abuts the isolation region and a fourth end and second sides comprising:
      a doped well that is disposed over the semiconductor substrate and extending between the second sides from the third end to the fourth end;
      a dielectric layer disposed over the doped well;
      a first conductive stripe disposed over the dielectric layer between the third end and the fourth end in longitudinal alignment with the drain axis;
      a second conductive stripe disposed over the dielectric layer between the third end and the fourth end in longitudinal alignment with the source axis;
   a drain finger electrode aligned over and coupled to both the drain finger and first conductive stripe; and
   a source finger electrode aligned over and coupled to both the source finger and the second conductive stripe, wherein the off-state linearization region has a second non-linear off-state capacitance that decreases as the drain-to-source voltage increases within the first voltage range.

2. The electronic component of claim 1 wherein the first non-linear off-state capacitance and the second non-linear off-state capacitance add together to form a substantially linear total off-state capacitance.

3. The electronic component of claim 2 wherein the first voltage range is between 10 V and 100 V.

4. The electronic component of claim 3 wherein the total off-state capacitance that is a parallel combination of the first non-linear off-state capacitance and the second non-linear off-state capacitance departs from a fixed capacitance value by no more than ±10%.

5. The electronic component of claim 2 wherein the first voltage range is between 30 V and 80 V.

6. The electronic component of claim 5 wherein the total off-state capacitance that is a parallel combination of the first non-linear off-state capacitance and the second non-linear off-state capacitance departs from a fixed capacitance value by no more than ±5%.

7. The electronic component of claim 1 wherein a total off-state capacitance that is a parallel combination of the first non-linear off-state capacitance and the second non-linear off-state capacitance is within ±1% of a fixed capacitance value for a radio frequency (RF) switch made up of the FET cells while an applied off-state voltage is within a second voltage range of 0 V to 30 V.

8. The electronic component of claim 1 further including a varactor control electrode coupled to the doped well and configured to receive a bias voltage provided by a varactor bias network.

9. The electronic component of claim 1 wherein the doped well has p+ doping.

10. The electronic component of claim 1 wherein the doped well has n+ doping.

11. The electronic component of claim 1 further including a body well disposed over the semiconductor substrate.

12. The electronic component of claim 11 wherein the body well has p+ doping.

13. The electronic component of claim 11 wherein the body well has n+ doping.

14. The electronic component of claim 11 further including a body electrode coupled to the body well.

15. The electronic component of claim 14 wherein the body electrode is configured to receive a body bias voltage from a body bias network.

16. The electronic component of claim 1 further including a buried oxide layer that separates the finger region from the semiconductor substrate.

17. The electronic component of claim 1 wherein the isolation region comprises a shallow trench isolation filled with a dielectric material.

18. The electronic component of claim 17 wherein the dielectric material is silicon dioxide ($SiO_2$).

19. An RF switch comprising the electronic component of claim 1, further including a plurality of transistors that are identical to the first transistor and include the first transistor wherein the transistors are coupled in series drain-to-source between an RF signal input terminal and an RF signal output terminal.

20. The RF switch of claim 19 is a silicon-on-insulator type.

* * * * *